US006405353B1

(12) United States Patent
Maheshwari

(10) Patent No.: US 6,405,353 B1
(45) Date of Patent: Jun. 11, 2002

(54) DUAL THRESHOLD DELAY MEASUREMENT/SCALING SCHEME TO AVOID NEGATIVE AND NON-MONOTONIC DELAY PARAMETERS IN TIMING ANALYSIS/CHARACTERIZATION OF CIRCUIT BLOCKS

(75) Inventor: Dinseh Maheshwari, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/467,098

(22) Filed: Dec. 10, 1999

(51) Int. Cl.[7] .................................. G06F 17/50
(52) U.S. Cl. .................................. 716/6
(58) Field of Search .................................. 716/2, 6, 4, 5

(56) References Cited

U.S. PATENT DOCUMENTS 6,029,122 A1 * 3/2001 Jyu .................................. 716/6

* cited by examiner

*Primary Examiner*—Matthew Smith
*Assistant Examiner*—Thuan Do
(74) *Attorney, Agent, or Firm*—Wagner, Murabito & Hao LLP

(57) ABSTRACT

Timing characterization/analysis of a number of circuit blocks of a library or an integrated circuit, where each circuit block has an associated rise threshold value and fall threshold value, is performed using a common rise voltage threshold value equal to a minimum one of the rise threshold values of all the circuit blocks and a common fall threshold value equal to a maximum one of the fall threshold values of all the circuit blocks. The rise threshold value of each of the circuit blocks may be determined through an iterative process in which a new rise threshold is determined for an input corresponding to an output threshold value equal to the previous rise or fall threshold. Similarly, the fall threshold value of each of the circuit blocks may be determined through an iterative process in which a new fall threshold is determined for an input corresponding to an output threshold value equal to the previous rise or fall threshold. These iterative processes may be repeated until the new rise and/or fall threshold is within a required tolerance value of the preceding rise and/or fall threshold.

20 Claims, 5 Drawing Sheets

DUAL THRESHOLD DELAY MEASUREMENT/SCALING SCHEME TO AVOID NEGATIVE AND NON-MONOTONIC DELAY PARAMETERS IN TIMING ANALYSIS/CHARACTERIZATION OF CIRCUIT BLOCKS

FIELD OF THE INVENTION

The present invention relates to the field of integrated circuit design and, in particular, to a scheme for eliminating the presence of negative and non-monotonic delay artifacts in timing characterizations/analyses of circuit blocks.

BACKGROUND

Modern integrated circuit design is usually carried out by engineers with the assistance of computer aided design (CAD) tools. Using CAD tools such as ECAD, HSPICE, Verilog, etc., the designers access a cell library to construct the target integrated circuit using the various basic logic cells available in the library. Usually, each cell in the library represents a previously designed and tested logic element.

For example, each cell may be first designed using the same CAD tools, which then predict the response of the designed cell to one or more input signals and in particular predict the propagation delays of output signals relative to various input signals. Based on this design, the cell may be fabricated on a semiconductor substrate, e.g., silicon, etc., and then packaged. Thereafter, real input signals may be applied to the packaged cell to measure the actual propagation delays of the output signals. By learning the actual operating characteristics of various cells in this way, the designers (or others) can recharacterize the logic cell(s) and/or recalibrate elements of the CAD system until the predicted propagation delays match the actual propagation delays. In this way, the library cells become useful design elements for constructing larger integrated circuits, the performance of which can be predicted based on the timing data that characterizes the library cells.

One way of determining the overall timing characteristics of an integrated circuit under test is through a report generated by a computer-based timing analysis tool. Such tools are often used to provide delay information for different circuit paths of the integrated circuit of interest. Such a report often provides raw data regarding the different paths through the integrated circuit, along with their associated delays, that can be used to compute the different timing characteristics, for example setup and hold times for inputs, and propagation delays for outputs.

However, such tools require that all the cells used in the design be characterized using the same threshold value. The conventional characterization tools used for timing characterization use a single common threshold value for all transitions for each cell in the library. By default, most conventional tools set this common threshold at one-half of the supply voltage, commonly designated as $V_{cc}/2$.

By way of example, consider the logic element chain 10 shown in FIG. 1. There are three logic elements in the chain: an input inverter 12, a buffer 14 and an output inverter 16. Input signals applied to the input of inverter 12 are logically inverted at the output thereof after a propagation delay $T_{pd\_inv1}$. Subsequently, this signal becomes an input signal to buffer 14, which provides an output signal to inverter 16 after a propagation delay $T_{pd\_buf}$. Finally, output inverter 16 provides an output signal that is the logical inverse of the input received from buffer 14 after a propagation delay $T_{pd\_inv2}$. Conventional timing analysis tools require that the voltage levels at which input and output signals of each of these devices switch be equal.

To meet the above requirement, the characterization/analysis tools use a single common threshold for all transitions on the inputs and the outputs, which is usually set to $V_{cc}/2$. Having such a single common threshold gives rise to problems, however, when one considers the actual behavior of devices such as inverters 12 and 16 and buffer 14. It may be the case that, in practice, the true input threshold of buffer 14 is below $V_{cc}/2$ for a rising input signal. That is, a voltage of less than $V_{cc}/2$ at the input of buffer 14 may cause the output thereof to begin switching logic states. Similarly, for a falling input signal, the buffer 14 may have a true threshold that is above $V_{cc}/2$.

Either of the above conditions can give rise to so-called "negative delays", or more generally, non-monotonic delays. That is, the artifacts caused by the use of a single common switching threshold may be manifest as overly optimistic propagation delays that do not resemble those that will be experienced in real-world circuits. FIG. 2 illustrates an example of such a negative delay. In the top illustration, an input signal is shown for an arbitrary logic element (e.g., buffer 14), while in the lower illustration an output signal of that logic element is shown. The input signal has some rise time (e.g., a period of time over which the signal rises from one voltage level, say 0 V, to another voltage level, say $V_{cc}$), as does the output signal. By convention, those of ordinary skill in the art refer to a period of time over which a signal rises from a lower voltage level to a higher voltage level as a rise time while the period of time over which a signal decreases from a higher voltage level to a lower voltage level is termed a fall time. Input signals and output signals may each have rise or fall times depending upon whether the signals are transitioning to lower or higher voltage levels or vice versa, respectively.

Conventional timing characterization/analysis tools assume that the output signal does not begin switching until the input signal has reached the single, common threshold value, say $V_{cc}/2$. The time between the point at which the output signal begins switching and when the logic state of the output signal changes (again, commonly chosen as $V_{cc}/2$) is regarded as the propagation delay ($T_{pd}$) associated with the logic element. Thus, conventional timing characterization/analysis tools may determine $T_{pd}$ as the time between the point where the input signal crosses the $V_{cc}/2$ threshold and the point where the output signal does likewise. Where, as shown in the illustration, the actual input threshold is below $V_{cc}/2$, however, such an analysis leads to a negative $T_{pd}$, in as much as the output signal switches (crosses $V_{cc}/2$) before the input signal reaches the $V_{cc}/2$ level.

Negative delay artifacts such as those illustrated in FIG. 2 can cause problems with the timing analysis, synthesis, and simulation of an integrated circuit and so are undesirable. In the past, designers have been forced to use a limited number of solutions to such problems. For example, efforts at shifting the single common threshold for rise and fall times from $V_{cc}/2$ to some other voltage level and observing the results for each logic element have been undertaken by some. This is a trial and error process that does not always produce a satisfactory result, for example because correcting a negative rise time delay for one logic element may result in a negative fall time delay for another. In other cases, designers may treat negative delays as "zero delays", essentially modeling a logic element as having no propagation delay whatsoever, but adding long hold times to the signals associated with those elements. Such characterizations are not only inaccurate, they tend to result in overly conservative characterizations of the device under test and so do not yield desirable results. Moreover, they are not useful for actual timing analyses of the device. What is needed therefore, is a scheme for eliminating negative delays that does not suffer from such drawbacks.

SUMMARY OF THE INVENTION

In one embodiment, a timing characterization/analysis of a number of circuit blocks of a library or an integrated circuit, each circuit block having an associated rise threshold value and fall threshold value, is performed using a common rise voltage threshold value equal to a minimum one of the rise threshold values of all the circuit blocks and a common fall threshold value equal to a maximum one of the fall threshold values of all the circuit blocks. The rise threshold value of each of the circuit blocks may be determined through an iterative process in which a new rise threshold is determined for an input corresponding to an output threshold value equal to the previous rise or fall threshold. This iterative process may be repeated until the new rise threshold is within a required tolerance value of the preceding rise threshold. Similarly, the fall threshold value of each of the circuit blocks may be determined through an iterative process in which a new fall threshold is determined for an input corresponding to an output threshold value equal to the previous rise or fall threshold. This iterative process may be repeated until the new fall threshold is within a required tolerance value of the preceding fall threshold.

A rise and fall threshold pair for a library of circuit blocks, each of which have corresponding rise and fall thresholds as determined according to the iterative process may then be selected. In general, any of the above processes may be implemented as computer-readable instructions stored in or recorded on computer-readable media (e.g., CD-ROMs, memories, disk drives, etc.).

In still another embodiment, delay information for a previously characterized set of circuit blocks may be scaled using minimum rise threshold and maximum fall threshold information for the circuit blocks. The delay information for each circuit block may be scaled by adding a time value derived using the minimum rise or maximum fall threshold information for the input and subtracting a time value derived using the minimum rise or maximum fall threshold information for the output.

BRIEF DESCRIPTION OF THE DRAWINGS

The present invention is illustrated by way of example, and not limitation, in the figures of the accompanying drawings in which like reference numerals refer to similar elements and in which.

DETAILED DESCRIPTION

A scheme for avoiding negative and non-monotonic delay parameters in timing characterizations/analyses of circuit blocks is disclosed herein. As will be discussed in greater detail below, the present scheme makes use of different input thresholds for rise and fall transitions for cells used in the design of an integrated circuit or a library of cells. Although a common rise threshold and a common fall threshold is used for every cell in the design or the library, this common rise/fall pair is guaranteed to be such that no negative delays will result. Thus, timing characterizations/analyses will not yield results that suffer from such artifacts. Although discussed with reference to certain illustrated embodiments, upon review of this specification, those of ordinary skill in the art will recognize that the present scheme may find application in a variety of systems. For example, throughout the following discussion reference will be made to rise/fall threshold pairs. While it is true that such threshold pairs may be adjusted in combination, it is equally true that either or both of the rise or fall thresholds may be adjusted independently of the other using the methods described herein. Therefore, in the following description the illustrated embodiments should be regarded as exemplary only and should not be deemed to be limiting in scope.

Figure 3:
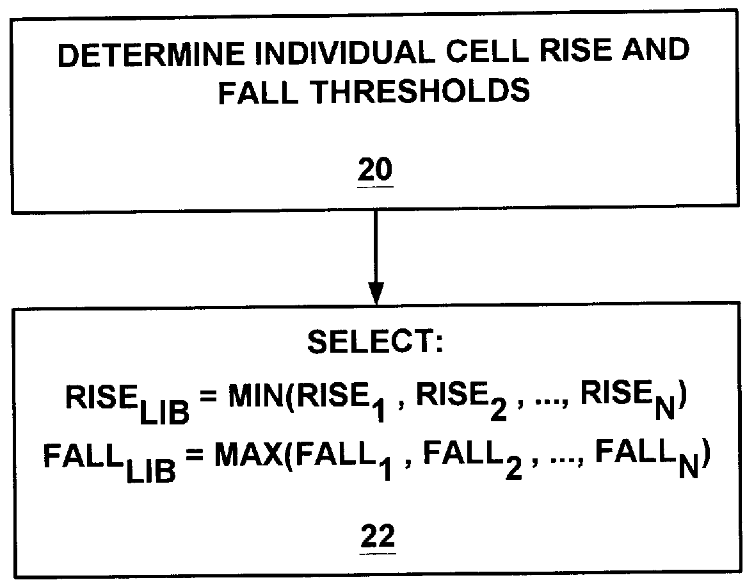
FIG. 3 illustrates one process for determining rise and fall threshold values for cell libraries in accordance with an embodiment of the present invention.

Under the present method, the rise/fall common threshold values for use in determining delay values for the cells of a cell library are determined as shown in FIG. 3. First, the rise/fall threshold pair for each individual cell (N) of the library $\{rise_N, fall_N\}$ is determined (step 20). Then, the common threshold values for the library $\{rise_{lib}, fall_{lib}\}$ are selected as the minimum rise threshold value for each of the cells and the maximum fall threshold value for each of the cells (step 22). That is:

$$rise_{lib}=MIN(rise_1, rise_2, \ldots rise_N)$$

$$fall_{lib}=MAX(fall_1, fall_2, \ldots fall_N),$$

where $rise_x$ is the rise threshold value for cell x and $fall_x$ is the fall threshold value for cell x.

Figure 4:
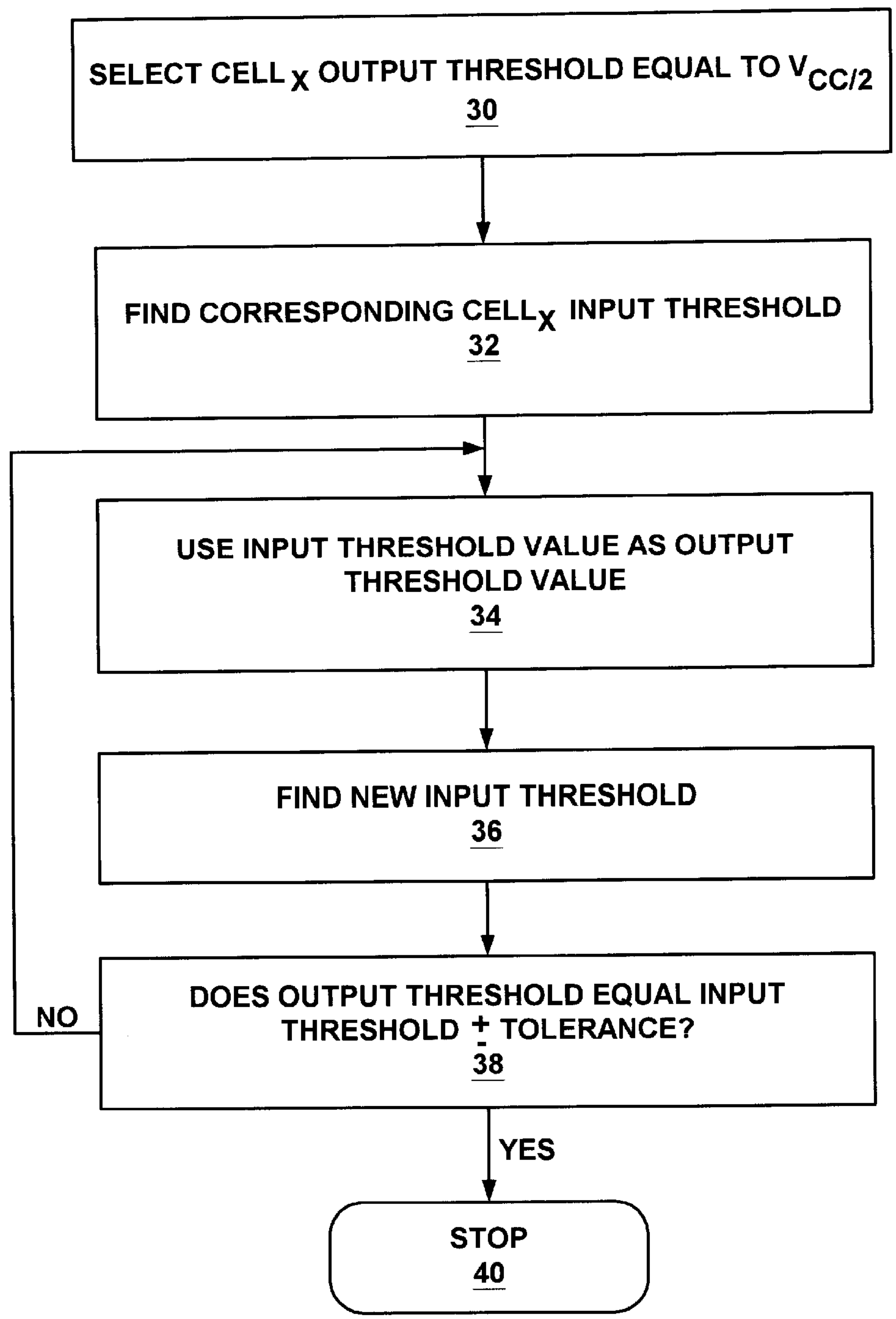
FIG. 4 illustrates one process for determining rise and fall thresholds of individual cells of a library for use according to an embodiment of the present invention.

The individual rise/fall threshold pairs for the cells are themselves determined as shown in FIG. 4. First (step 30), for any cell, the output rise/fall threshold pair is selected as $V_{cc}/2$, as in the conventional case. Then (step 32) the corresponding input rise/fall threshold value (e.g., a voltage level) pair for that output threshold is found. This input rise/fall threshold pair is then used as a new output rise/fall threshold value (step 34) and a new corresponding input rise/fall threshold pair is found (step 36). This process iterates (step 38) until the input and output threshold values agree within a selected tolerance value (say±5%), at which point the current values of the rise and fall thresholds are selected as the rise/fall threshold pair for the cell (step 40).

Figure 1:
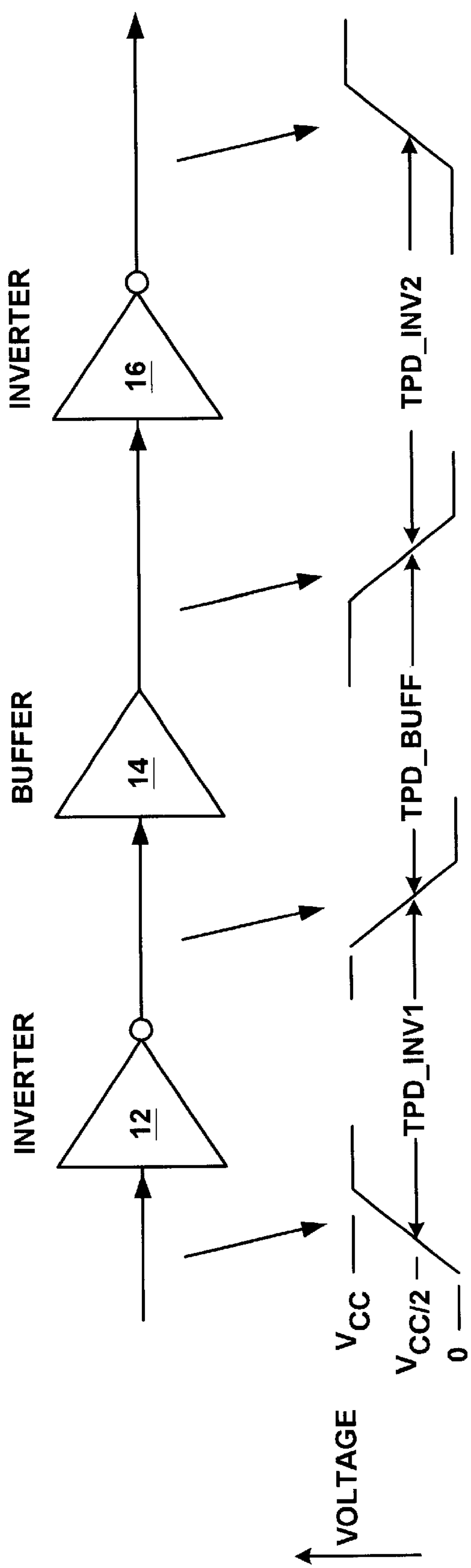
FIG. 1 illustrates an example of a chain of logic elements, the timing delay characteristics of which may be determined according to the methods of the present invention.
Figure 2:
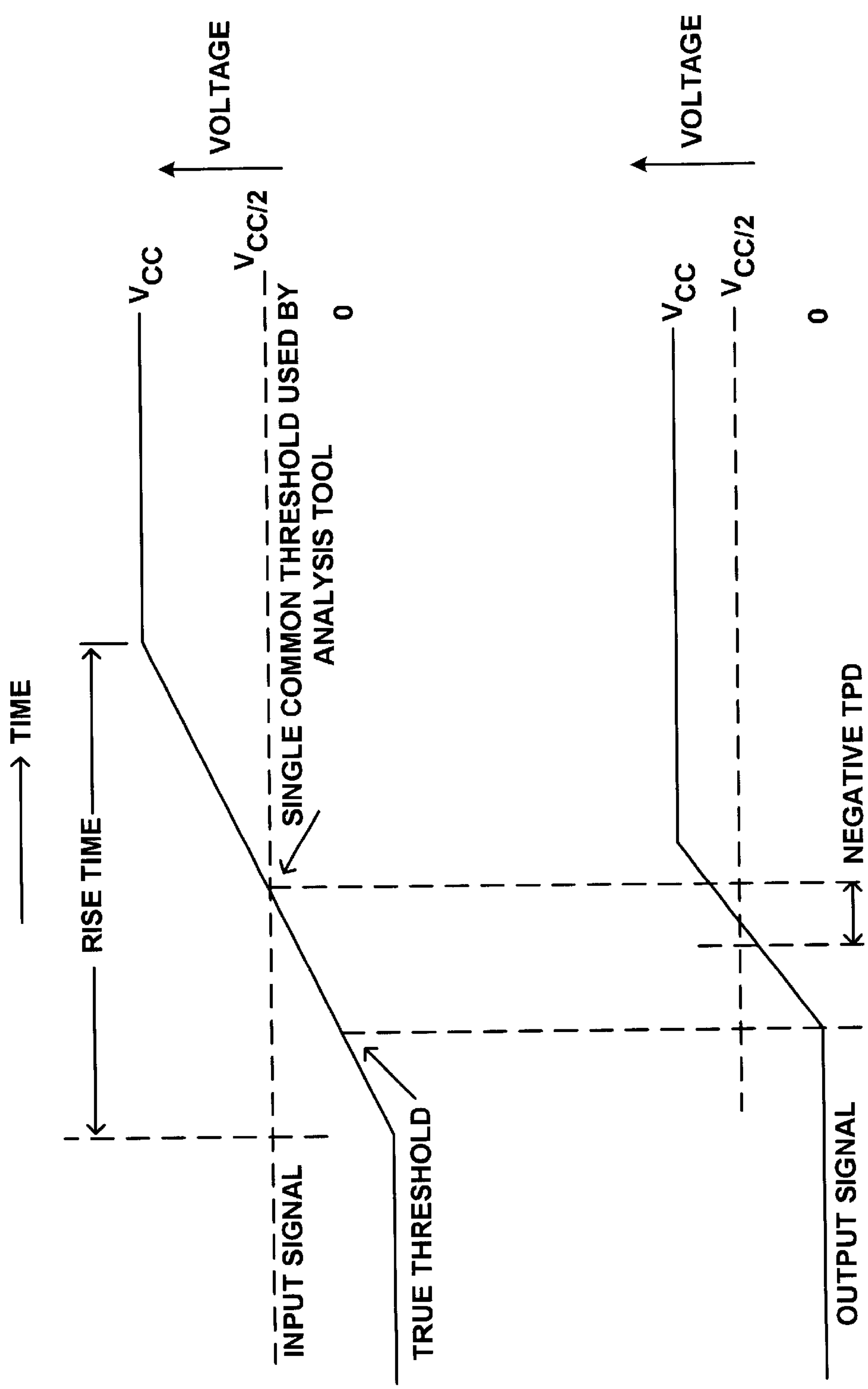
FIG. 2 illustrates an example of a timing characterization that has produced a negative delay value.

It should be apparent that using the minimum rise threshold of any of the cells for a circuit under analysis (e.g., a chain such as that illustrated in FIG. 1) will guarantee that no cell will begin switching at a lower voltage level. That is, the present method guarantees that no cell will switch earlier than the selected rise threshold value. Likewise, the present method guarantees that no fall threshold will be crossed earlier than the selected fall threshold for the library.

In cases where the delay data for a library has already been obtained using the conventional single common threshold technique described above, it may not be desirable to recharacterise the entire library in accordance with the above scheme (such processes can take weeks or months to complete). Nevertheless, it would be desirable to avoid the use of the delay data obtained in such a fashion because of the chance for encountering non-monotonic delays. Therefore, an adaptation of the present scheme can be employed to reduce or even eliminate such possibilities.

This procedure relies on techniques similar to those presented above. More specifically, having the benefit of the input/output transition times and threshold values for each individual cell from the previous characterization data (e.g., using the conventional $V_{cc}/2$ approach), and using linear regions of the transition curves, the $\{rise_{lib}, fall_{lib}\}$ pair for the entire library can be determined as:

$$rise_{lib}=MIN(rise_1, rise_2, \ldots rise_N)$$

$$fall_{lib}=MAX(fall_1, fall_2, \ldots fall_N)$$

where, N=the number of distinct {rise, fall } threshold pairs for the inputs in the library.

Figure 5:
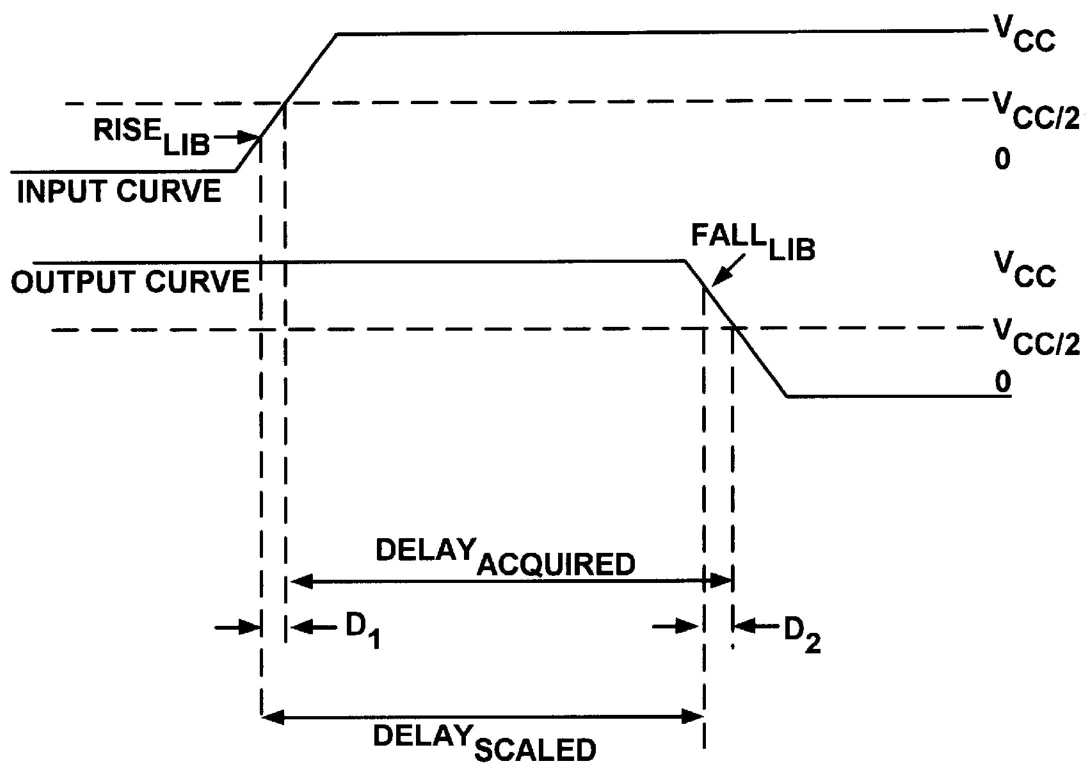
FIG. 5 illustrates one method by which previously acquired delay data for a library of cells may be scaled in accordance with an embodiment of the present invention.

Then, a scaling can be performed, as shown in FIG. 5. In essence, the delay value obtained from the conventional characterization process is scaled by adding a time increment $d_1$ corresponding to the time between the minimum rise or maximum fall threshold value and the $V_{cc}/2$ threshold value for the input transition and subtracting a time increment $d_2$ corresponding to the time between the minimum rise or maximum fall threshold value and the $V_{cc}/2$ threshold value for the output transition. In other words:

$$Delay_{scaled}=Delay_{acquired}+d_1-d_2$$

These times can be determined based on the known slopes of the rise and fall curves from the previous characterization data.

Thus a scheme for avoiding negative and non-monotonic delay parameters in timing analyses/characterizations of circuit blocks has been described. In general, the present schemes may be embodied as computer-readable instructions for timing analysis (e.g., for execution on any conventional computer system), for example as stored in a memory or other computer-readable medium (e.g., a hard drive, a compact disk, etc.). Although the foregoing description and accompanying figures discuss and illustrate specific embodiments, it should be appreciated that the present invention is to be measured only in terms of the claims that follow.

What is claimed is:

1. A method of avoiding negative delay, comprising performing a timing characterization/analysis of a number of circuit blocks of a library or an integrated circuit, each circuit block having an associated rise threshold value and fall threshold value, using a common rise voltage threshold value equal to a minimum one of the rise threshold values of all of the circuit blocks and a common fall threshold value equal to a maximum one of the fall threshold values of all the circuit blocks.

2. The method of claim 1 wherein the rise threshold value of each of the circuit blocks is determined through an iterative process in which a new input rise threshold is determined for an input corresponding to an output threshold value equal to a previous rise or fall threshold.

3. The method of claim 2 wherein the iterative process is repeated until the new input rise threshold is within a required tolerance value of a preceding rise threshold.

4. The method of claim 1 wherein the fall threshold value of each of the circuit blocks is determined through an iterative process in which a new fall threshold is determined for an input corresponding to an output threshold value equal to a previous rise or fall threshold.

5. The method of claim 4 wherein the iterative process is repeated until the new fall threshold is within a required tolerance value of a preceding fall threshold.

6. A computer-readable medium having stored therein or recorded thereon computer-readable instructions corresponding to the method of claim 1.

7. A method of determining rise threshold value, comprising performing a timing charaotcrization/analysis of one or more circuit blocks of an integrated circuit having an associated rise threshold value and fall threshold value, the rise threshold value of the circuit block being determined through an iterative process in which a new input rise threshold is determined for an input corresponding to an output threshold value equal to a previous rise or fall threshold for all the circuit blocks.

8. The method of claim 7 wherein the iterative process is repeated until the new input rise threshold is within a required tolerance value of a preceding rise threshold.

9. A computer-readable medium having stored thereon or recorded thereon computer-readable instructions corresponding to the method of claim 7.

10. A method of determining fall threshold value, comprising performing a timing characterization/analysis of one or more circuit blocks of an integrated circuit having an associated rise threshold value and fall threshold value, the fall threshold value of the circuit block being determined through an iterative process in which a new fall threshold is determined for an input corresponding to an output threshold value equal to a previous rise or fall threshold for all the circuit blocks.

11. The method of claim 10 wherein the iterative process is repeated until the new fall threshold is within a required tolerance value of a preceding fall threshold.

12. A computer-readable medium having stored thereon or recorded thereon computer-readable instructions corresponding to the method of claim 10.

13. A method of avoiding negative delay, comprising scaling delay information for a previously characterized set of circuit blocks using minimum rise threshold and maximum fall threshold information for all the circuit blocks forming a library.

14. The method of claim 13 wherein the delay information for each circuit block is scaled by adding a time value derived using the minimum rise or maximum fall threshold information for an input transition and subtracting a time value derived using the minimum rise or maximum fall threshold information for an output transition.

15. A computer-readable medium having stored therein or recorded thereon computer-readable instructions comprising the method of claim 13.

16. A computer-readable medium comprising computer-readable instructions which, when executed by a computer cause the computer to perform a timing characterization/analysis of a number of circuit blocks of an integrated circuit, each circuit block having an associated rise threshold value and fall threshold value, using a common rise voltage threshold value equal to a minimum one of the rise threshold values of all the circuit blocks and a common fall threshold value equal to a maximum one of fall threshold values of all the circuit blocks.

17. The computer-readable medium of claim 16 wherein the rise threshold value and fall threshold value of each of the circuit blocks is determined through an iterative process in which a new input rise threshold is determined corresponding to an output threshold equal to a previous rise or fall threshold.

18. The computer-readable medium of claim 17 wherein the iterative process is repeated until the new rise threshold is within a required tolerance value of a preceding rise threshold.

19. The computer-readable medium of claim 16 wherein the rise threshold value and fall threshold value of each of the circuit blocks is determined through an iterative process in which a new fall threshold is determined corresponding to an output threshold equal to a previous rise or fall threshold.

20. The computer-readable medium of claim 18 wherein the iterative process is repeated until the new fall threshold is within a required tolerance value of a preceding fall threshold.

* * * * *

UNITED STATES PATENT AND TRADEMARK OFFICE

CERTIFICATE OF CORRECTION

PATENT NO. : 6,405,353 B1
DATED : June 11, 2002
INVENTOR(S) : Dinesh Maheshwari

It is certified that error appears in the above-identified patent and that said Letters Patent is hereby corrected as shown below:

Title page,
Item [75], should read: -- [75] Dinesh Maheshwari, Fremont, Ca (US) --

Signed and Sealed this

Fifteenth Day of October, 2002

*Attest:*

JAMES E. ROGAN

*Attesting Officer* *Director of the United States Patent and Trademark Office*